United States Patent [19]

Sakata

[11] Patent Number: 5,374,929
[45] Date of Patent: Dec. 20, 1994

[54] DA CONVERTER WHICH COMBINES OUTPUT OF A PLURALITY OF LOW PASS FILTERS SELECTIVELY ENABLED AND DISABLED BY RESPECTIVE ELECTRONIC SWITCHES

[75] Inventor: Haruo Sakata, Tokyo, Japan
[73] Assignee: Clarion Co., Ltd., Tokyo, Japan
[21] Appl. No.: 981,182
[22] Filed: Nov. 24, 1992
[30] Foreign Application Priority Data Dec. 3, 1991 [JP] Japan ................. 3-347900

[51] Int. Cl.⁵ ............................................. H03M 1/66
[52] U.S. Cl. ...................................... 341/150; 375/24
[58] Field of Search ............... 341/144, 150, 145, 152, 341/153; 375/24, 25, 34

[56] References Cited

U.S. PATENT DOCUMENTS 4,616,185 10/1986 van Roermund ............... 375/24 X
4,739,304  4/1988 Takeda et al. .................. 341/144 X

FOREIGN PATENT DOCUMENTS 2-220537  9/1990  Japan .

Primary Examiner—Brian K. Young
Attorney, Agent, or Firm—Flynn, Thiel, Boutell, & Tanis

[57] ABSTRACT

In a DA converting circuit using a PAM circuit and low pass filters, an analogue signal of high quality can be obtained by removing ringing due to the cut-off frequency of the filters. A PAM signal outputted by the PAM circuit is switched on and off by a plurality of electronic switches arranged in parallel. Further outputs thereof are combined by an adding circuit through a plurality of LPFs to obtain a synthesized analogue signal. The inputs and the outputs of the LPFs described above are turned on and off by a plurality of electronic switches linked with each other. The different switches are driven by pulses produced from a clock signal, corresponding to a sampling frequency for the PAM circuit.

12 Claims, 8 Drawing Sheets

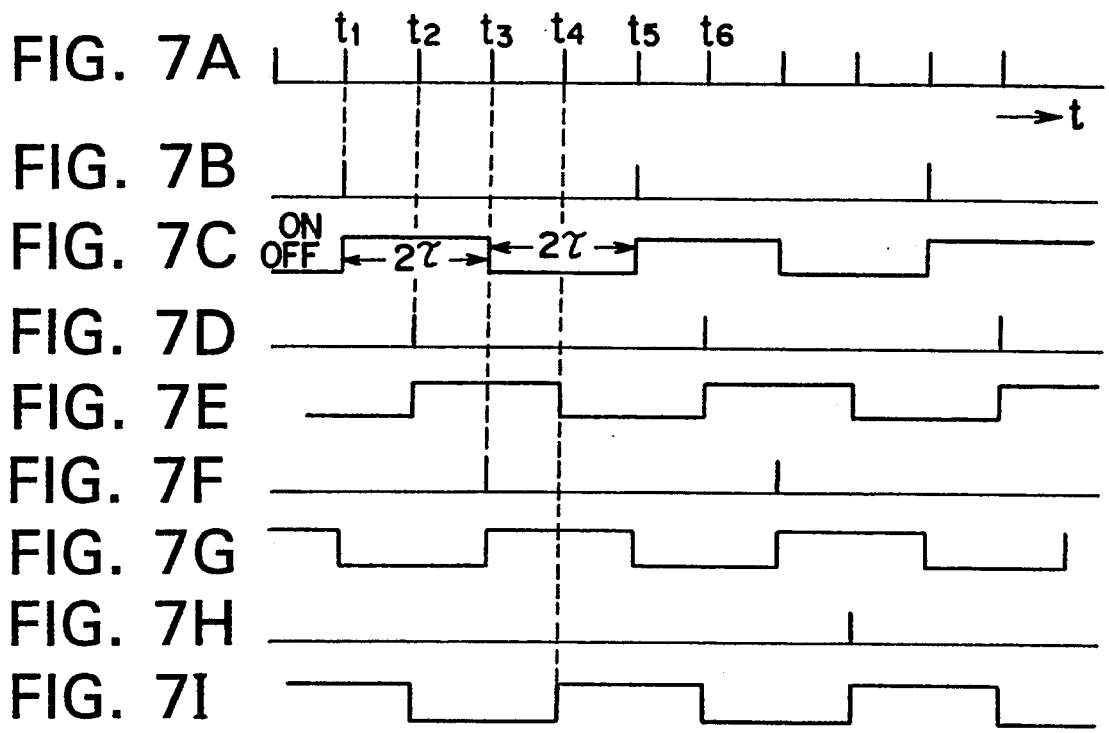
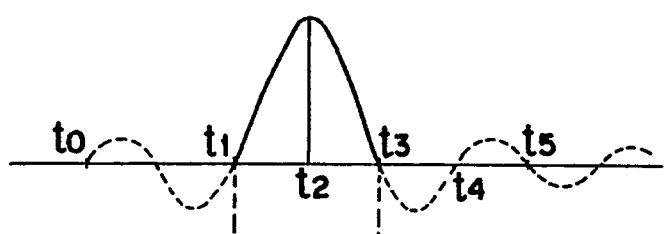
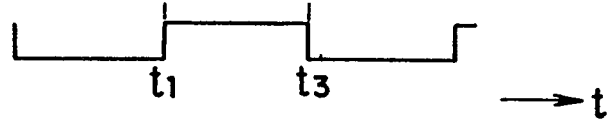

DA CONVERTER WHICH COMBINES OUTPUT OF A PLURALITY OF LOW PASS FILTERS SELECTIVELY ENABLED AND DISABLED BY RESPECTIVE ELECTRONIC SWITCHES

FIELD OF THE INVENTION

The present invention relates to a DA converter, which converts a digital signal into an analogue signal, and in particular to a construction of a DA converter consisting of a PAM (Pulse Amplitude Modulation) circuit and a filter for suppressing generation of ringing of high frequency components due to the cut-off-frequency of the filter.

BACKGROUND OF THE INVENTION

FIG. 10 shows a prior art DA converter consisting of a PAM circuit 1 and a low pass filter 2, in which pulses for different bits of a digital signal D, which is to be converted into an analogue signal, are inputted to the PAM circuit 1; a pulse amplitude modulated signal P as indicated by (a) in FIG. 11 is outputted by the circuit; and low frequency components of the pulse amplitude modulated signal P are extracted through the low pass filter 2 having frequency characteristics indicated by (d) in FIG. 11 to obtain an analogue signal indicated by (b) in FIG. 11. Denoting the cut-off frequency of the low pass filter 2 by $f_c$ and the sampling frequency of the PAM circuit 1 by $f_s$, $f_c = f_s/2$ is valid (by the sampling theorem) and the interpolation function by this low pass filter 2 can be represented by (c) in FIG. 11.

Consequently, when time sequential discrete components, $t_1, t_2, t_3 \ldots$ etc. of the pulse amplitude modulated signal P indicated by (a) in FIG. 11 pass through the low pass filter 2 having the cut-off frequency $f_c = f_s/2$, as clearly seen from (c) in FIG. 11, the output for the pulse at $t = t_1$ is zero at $t = n\tau$ ($\tau = 1/f_s$) and when the pulse train of the pulse amplitude modulated signal indicated by (a) in FIG. 11 passes through the low pass filter 2 having the characteristics indicated by (d) in FIG. 11, the original signal represented by the pulse train described above is reproduced and it is smoothly completed also for the parts other than $t = t_1 \pm n\tau$, as indicated by (b) in FIG. 11.

However by the prior art DA converting method described above, as clearly seen from (b) in FIG. 11, ringing determined by the cut-off frequency $f_c$ of the low pass filter 2 is produced between $t_{-2}$ and $t_{-1}$ and between $t_{-1}$ and $t_0$.

In general, the part of the ringing generated by the DA converter is set at a part having no sensitivity for the sense of sight and the sense of hearing, when the signal is displayed on a play back device, but in the case where the cut-off frequency $f_c$ ($f_c = f_s/2$) is set very closely to the limit, it can produce often disturbance in the sense of sight and the sense of hearing.

Therefore the oversampling method has been proposed, by which the sampling frequency is equivalently increased to $mf_s$ ($m \pm 2$) by complementing vacant parts in the PAM signal and the cut-off frequency of the low pass filter is set below $mf_s/2$.

By this method, even if ringing as described previously is produced, it is at a high frequency so that it produces no disturbance, when a signal obtained by restoring it is displayed.

However, together with non-linearity of the play back device, the high frequency ringing may worsen reproduction of low level signals (e.g. black level and silent parts).

(a) in FIG. 12 shows an intensity distribution of a stepwise original signal (step from black to white) and (b) in the same figure indicates an image, when it is reproduced on a display system. On the other hand, (c) in FIG. 12 shows a signal waveform, in the case where a converter having characteristics indicated by (b) in FIG. 11 is used for the DA converter and (d) indicates an image reproduced from the signal indicated by (c), from which it can be clearly seen that black and white stripes are produced in the dark portion.

Apart therefrom, there is known another prior art DA converter disclosed in JP-A-Hei 2-220537, which is a device comprising a digital signal processing circuit, which digital-processes an input signal to output two series of digital signals, whose phases are orthogonal to each other; two digital-analogue converters, which convert these two series of digital signals into respective analogue signals; two low pass filters, which remove respective harmonic components contained in outputs of these two digital-analogue converters, each of these two low pass filters including an MOSFET analogue filter having variable frequency characteristics; two multipliers, which multiply outputs of these two low pass filters by respective carriers, whose phases are orthogonal to each other; an adder, which adds outputs of these two multipliers; and a control circuit, which controls automatically the frequency characteristics of these MOSFET analogue filters by using clock signals, which are signals inputted to the digital signal processing circuit. However this converter has a drawback that the construction is very complicated and thus it is expensive.

OBJECT OF THE INVENTION

The object of the present invention is to provide a construction of such a DA converter capable of obtaining an analogue signal of high quality by removing ringing due to the low pass filter used for extracting low frequency components from a PAM signal.

SUMMARY OF THE INVENTION

In order to achieve the above object, a DA converter according to the present invention comprises pulse signal generating means for generating pulse signals having a first sampling period; delayed pulse signal generating means for delaying the pulse signals by predetermined different times to generate a plurality of delayed pulse signals; switching signal generating means for generating switching signals set with a period corresponding to the sampling period and at different ON/OFF times, based on the pulse signals and the delayed pulse signals; a plurality of filter means for extracting low frequency component signals from digital component signals sampling-processed with the sampling period; switching means for switching an input and an output of each of the filter means by each of the switching signals set at the different ON/OFF times; and synthesizing means for synthesizing an analogue component signal by combining outputs of the plurality of filter means.

In the DA converter according to the present invention, pulse signals having a predetermined sampling period are generated by a predetermined control signal and the pulse signals are delayed by different times to output a plurality of delayed pulse signals.

Switching signals for turning on and off filters, having a period, which is predetermined times as long as the sampling period, and set at different ON/OFF times, are generated, based on the pulse signals and the delayed pulse signals.

Inputs and outputs of a plurality of filter means for extracting low frequency components from a sampling output are switched so as to be turned on and off on the basis of the switching signals described above. Further supply of digital component signals to the filter means is turned on and off with a timing different therefrom.

An analogue component signal is obtained by adding a plurality of low frequency components to each other from the different filter means.

BRIEF DESCRIPTION OF THE DRAWINGS

FIG. 7 is a time chart for explaining the operation of another embodiment of the present invention;

FIG. 8 shows an input and an output waveform of a DA converter;

DETAILED DESCRIPTION

Figure 1:
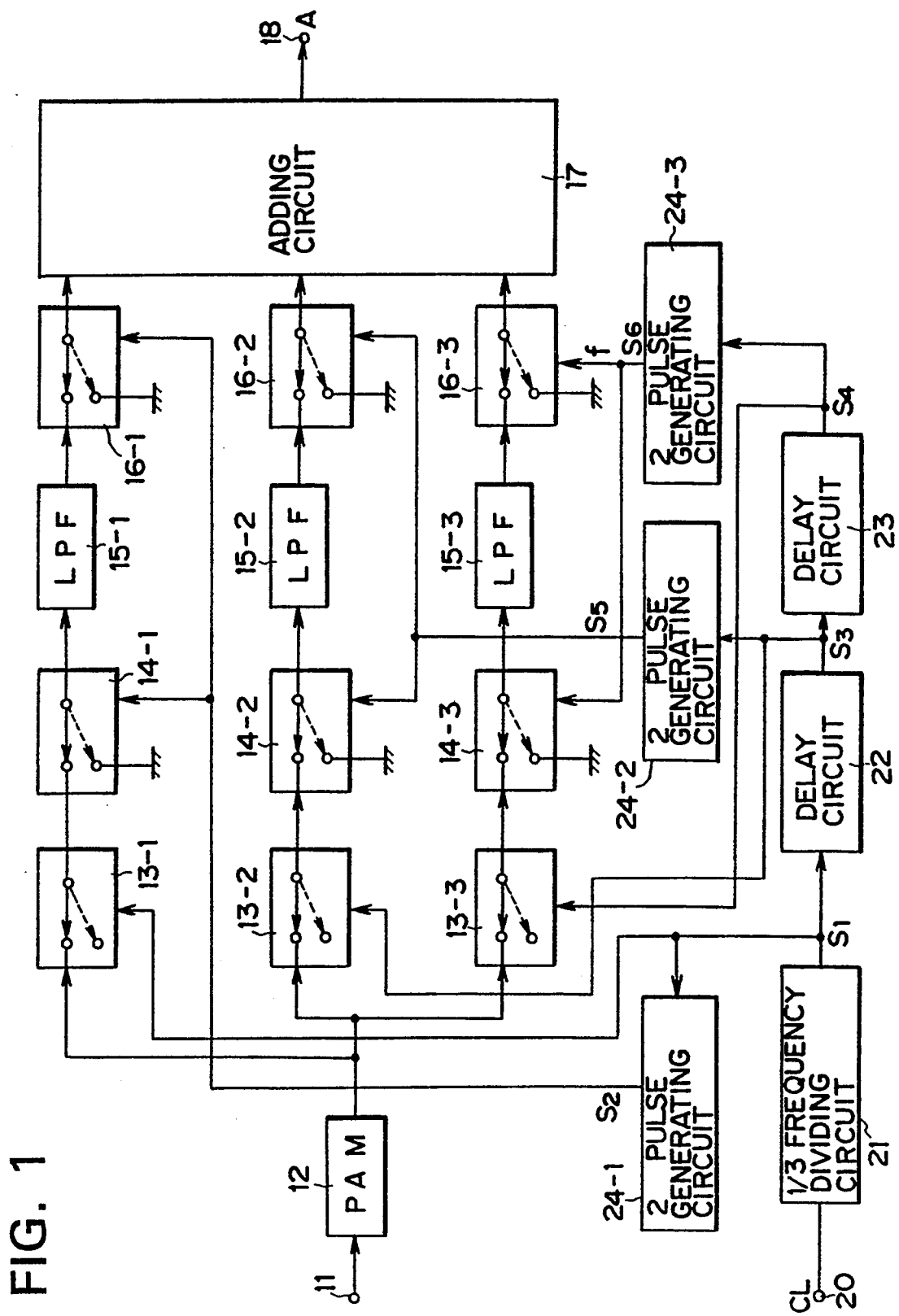
FIG. 1 is a block diagram indicating the construction of a DA converter in an embodiment of the present invention.
Figure 2A:
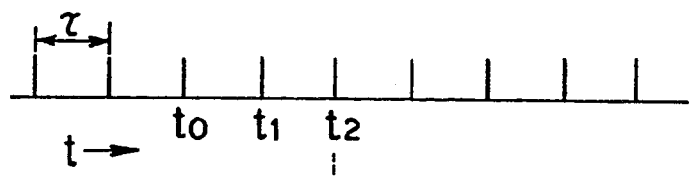
FIG. 2 is a time chart for explaining the operation of the above embodiment.
Figure 2B:
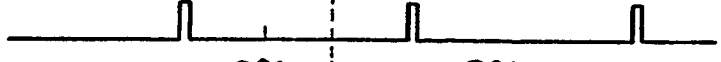
Figure 2C:
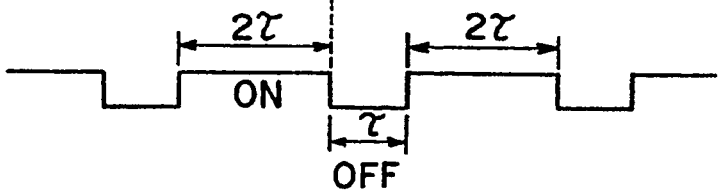
Figure 2D:
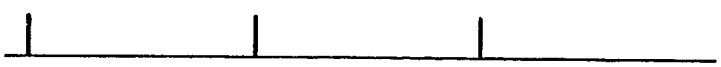
Figure 2E:
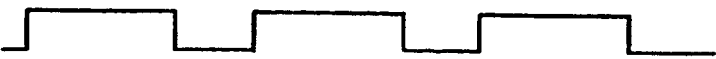
Figure 2F:
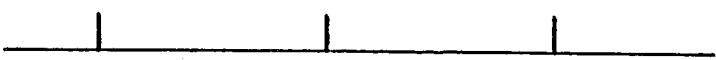
Figure 2G:

Hereinbelow some embodiments of the present invention indicated in the drawings will be explained.

FIG. 1 shows an embodiment of the DA converter according to the present invention, in which reference numeral 11 is an input terminal for a pulse signal for each bit of a digital signal; 12 is a PAM circuit constituting the sampling processing means described above; 13-1 to 13-3 are electronic switches; 14-1 to 14-3 and 16-1 to 16-3 are electronic switches linked therewith, respectively; 15-1 to 15-3 are low pass filters (LPF) having a cut-off frequency $f_c = f_s/2$ constituting the filter means described above; 17 is an adding circuit constituting the adding means described above; and 18 is an output terminal for the analogue signal.

20 is an input terminal for a clock signal CL indicated by (a) in FIG. 2, having a frequency, which is in accordance with the sampling frequency $f_s$. The interval of the clock signal $\tau = 1/f_s$ and it is in accordance in time e.g. with the pulse train indicated by (a) in FIG. 11.

21 is a ⅓ frequency dividing circuit constituting the sampling pulse generating means described above, which generates a pulse series $S_1$ indicated by (b) in FIG. 2, having a frequency $f_s/3$, starting from the clock signal CL described above. 22 and 23 are delaying circuits.

24-1 to 24-3 are pulse generating circuits, which generate pulses having a width of $2\tau$.

In the embodiment described above, the pulse train $S_1$ is applied to the pulse generating circuit 24-1, which outputs pulses $S_2$ having a width of $2\tau$ indicated by (c) in FIG. 2 to the electronic switches 14-1 and 16-1 on the basis thereof. In this way the sides indicated by full lines of these switches in FIG. 1, i.e. the input and the output of the filter 15-1 are turned on. On the other hand, in the period of time of $\tau$ indicated by (c) in FIG. 2, the switches 14-1 and 16-1 are set as indicated by broken lines so that the input and the output of the filter 15-1 are turned off.

On the other hand, the pulse series $S_1$ described previously is delayed by $\tau$ by each of the delaying circuits 22 and 23, respectively. Outputs $S_3$ and $S_4$ thereof drive the switches 13-2 and 13-3, respectively. Further output pulses $S_5$ of the pulse generating circuit 24-2 drive the switches 14-2 and 16-2, while output pulses $S_6$ of the pulse generating circuit 24-3 drive the switches 14-3 and 16-3.

(d), (e), (f) and (g) in FIG. 2 indicate the pulses $S_3$, $S_4$, $S_5$ and $S_6$ described above, respectively.

Figure 3A:
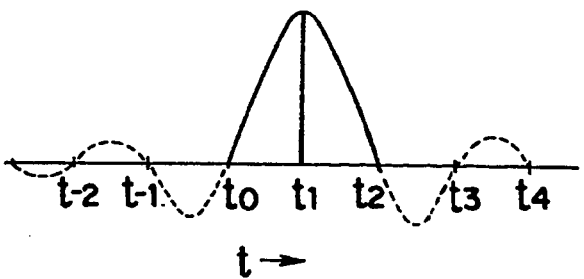
FIG. 3 shows input and output waveforms in the above embodiment.
Figure 3B:
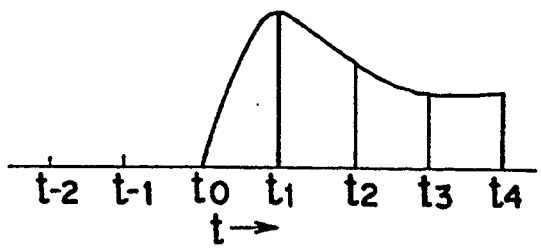

The pulse amplitude modulated signal P at a point of time $t = t_1$ is as indicated by (a) in FIG. 3 and at $t < t_0$ and $t > t_2$ no ringing is produced. Thus, for the pulse train indicated by (a) in FIG. 11, an analogue signal A indicated by (b) in FIG. 3 is obtained and at $t < t_0$ no ringing is produced.

Although, in the construction indicated in FIG. 1, it is supposed that for example the pulse amplitude modulated signal P is gated by the signal indicated by (b) in FIG. 2 so that the input and the output of the low pass filter is turned on during $2\tau$ succeeding the pulse $S_1$ indicated by (b) in FIG. 2 and turned off during $\tau$ succeeding it in turn, as indicated by (c) in FIG. 2, this is only a basic operation.

Figures 4, 5B, 5D, 5F, 5H:
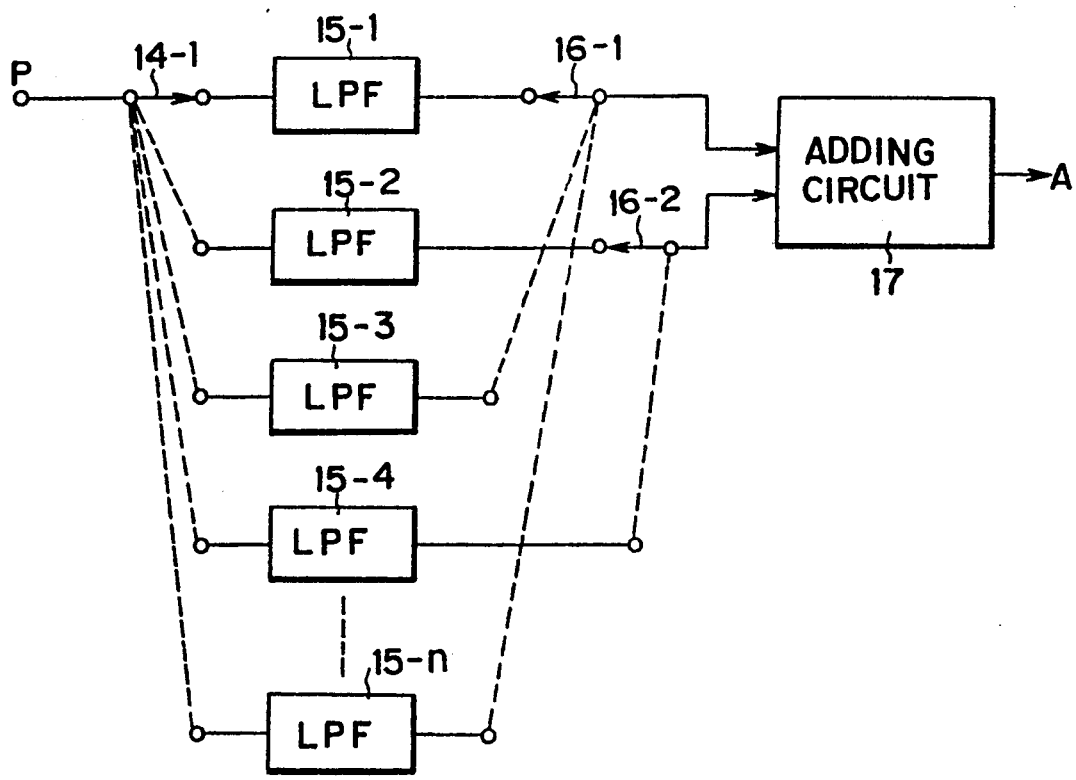
FIG. 4 is a block diagram indicating an input and output switching method for different low pass filters in the above embodiment.
Figure 5A:
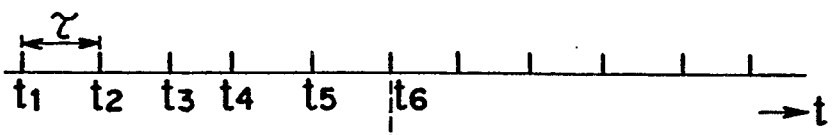
FIG. 5 is a timing chart for explaining the operation of the method indicated in FIG. 4.
Figure 5C:
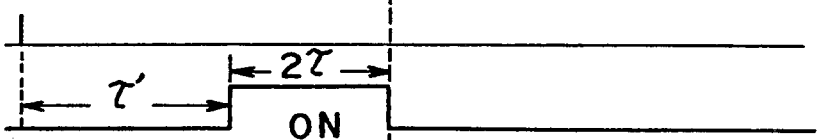
Figure 5E:
Figure 5G:
Figure 5I:
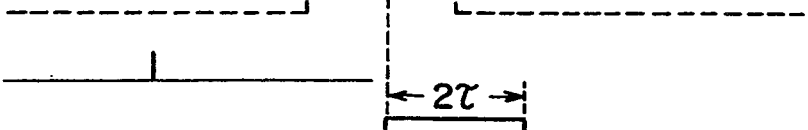

The low pass filters 15-1, 15-2, ..., 15-n are arranged in parallel, as indicated in FIG. 4. The inputs thereof are switched one after another with the interval $\tau$ of the pulse amplitude modulated signal P by the electronic switch 14-1. The outputs are connected e.g. with the filters 15-1 and 15-2 for $2\tau$ by switching the electronic switches 16-1 and 16-2 and the outputs are added to each other by the adding circuit 17 to obtain the analogue signal A. In this case, the switch 16-1 is turned on, after the switch 14-1 has been connected with the filter 15-1. This is effected in such a manner that, if characteristics of the filter 15-1 for a pulse input are as indicated by (d) in FIG. 11, on the output side of the filter 15-1, the switch 16-1 is turned on at $t = t_0$ and off at $t = t_2$, while the switch 16-2 is turned on at $t = t_1$ and off at $t = t_3$.

FIG. 5 shows the timing of the operation of the different switches indicated in FIG. 4. Here $t = t_0$ in (c) in FIG. 2 corresponds to a point of time, where $\tau'$ has lapsed after $t_1$. That is, for the clock signal CL indicated by (a) in FIG. 5, for a pulse amplitude modulated signal P at $t = t_1$ indicated by (b) in the same figure, the switch 14-1 is turned on at $t = t_1$, while the switch 16-1 is turned on for $2\tau$ after $\tau'$, as indicated by (c) in the same figure. The full lines in FIG. 5 correspond to channels 16-1, ..., while the broken lines correspond to channels 16-2...

Figure 6A:
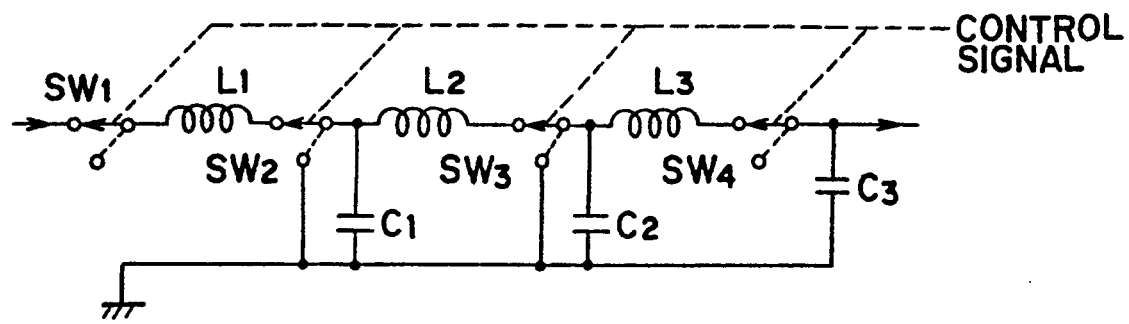
FIG. 6 shows a an example of the ON/OFF mechanism of a low pass filter.
Figure 6B:
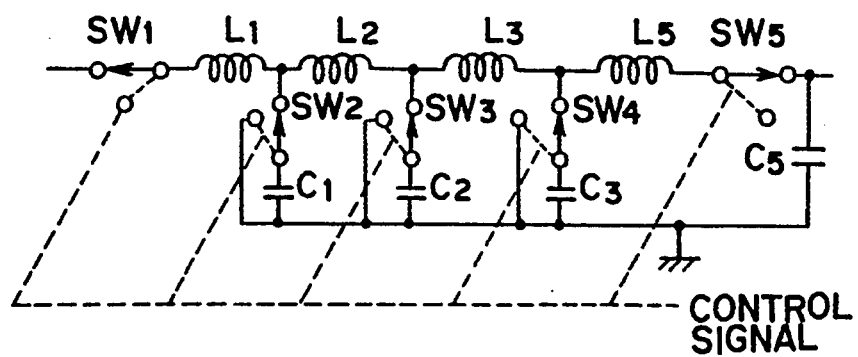

In order to shorten the switching time $\tau'$ of the switches 15-1 to 15-n, it is necessary to improve response characteristics for turning on and off of the filters 15-1 to 15-n. For this reason, each of electronic switches $SW_1$, $SW_2$, $SW_3$, $SW_4$ and $SW_5$ is arranged in each of $(L_1, C_1)$, $(L_2, C_2)$, $(L_3, C_3)$, $(L_4, C_4)$ and $(L_5, C_5)$ constituting filters as indicated by (a) or (b) in FIG. 6. These switches are driven by a control signal, linked together. The filters are connected, when the switches are in the position indicated by full lines, and not connected, when they are in the position indicated by broken lines.

FIG. 7 is a timing chart of the different switches in a filter construction of n=4 (four phases). (a) in the same figure indicates the clock signal CL; (b) the gate pulse for the pulse amplitude modulated signal P at $t=t_1$; and (c) pulses controlling ON and OFF of the input and the output of the low pass filter 16-1. Here it is supposed that the interval therebetween is $2\tau$. Similarly (d) and (e) in FIG. 7 show pulses corresponding to $t=t_2$; (f) and (g) pulses corresponding to $t=t_3$; and (h) and (i) pulses corresponding to $t=t_4$. They return to (b) and (c) for $t=t_5$.

(a) in FIG. 8 shows a DA converted output waveform for a pulse input at $t=t_1$ and (b) in the same figure indicates a pulse waveform for turning on and off the input and the output of the filter (corresponding to (c) in FIG. 7).

Figure 9:
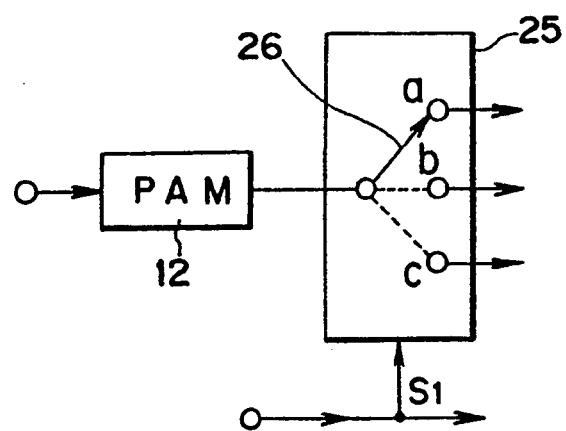
FIG. 9 is a block diagram of an example, in which the embodiment indicated in FIG. 1 is partly modified.
Figure 10:
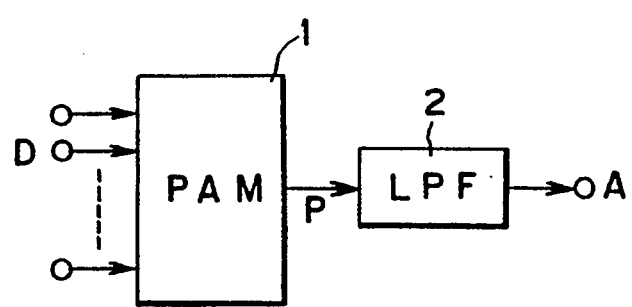
FIG. 10 is a block diagram showing an example of the construction of a prior art DA converter.
Figure 11A:
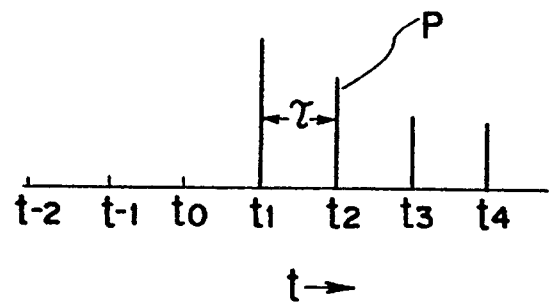
FIG. 11 shows waveforms for explaining the operation of the prior art example described above.
Figure 11B:
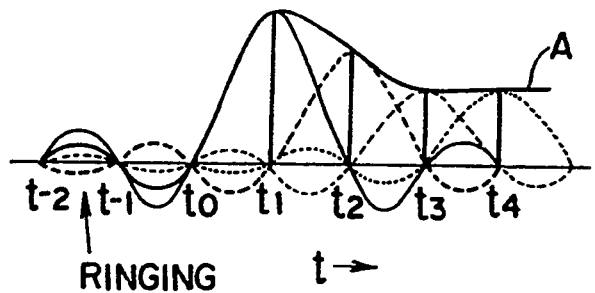
Figure 11C:
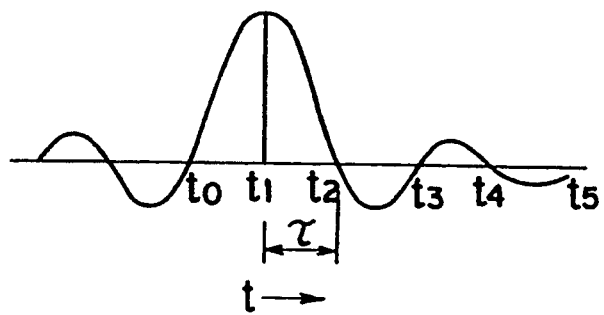
Figure 11D:
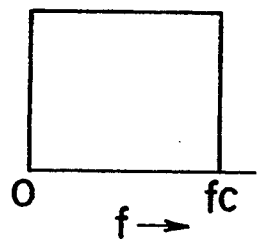
Figure 12A:
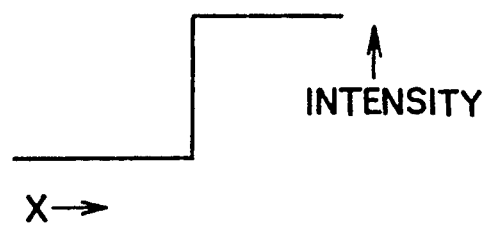
FIG. 12 shows an input and an output waveform of a DA converter for image signals.
Figure 12B:
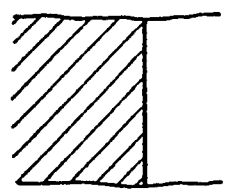
Figure 12C:
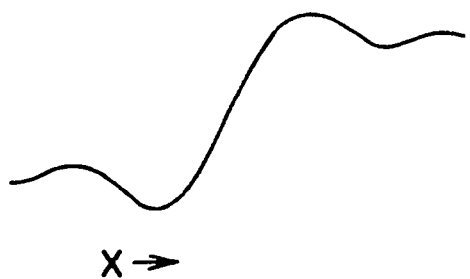
Figure 12D:
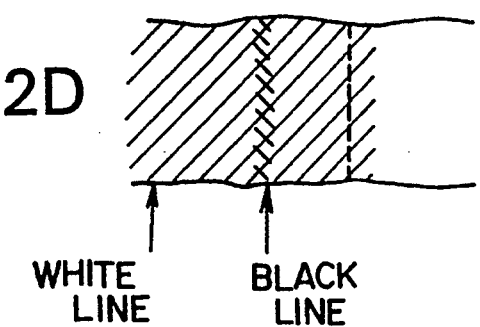

FIG. 9 shows a construction, in which the electronic switches 14-1 to 14-3 and the pulse generating circuits 24-1 to 24-3 driving them in the embodiment indicated in FIG. 1 are replaced by a ratchet circuit 25, in which a contact 26 proceeds as a, b, c, a, b, c, . . . for every pulse $S_1$.

As explained above, according to the present invention, in a DA converter using a PAM circuit and filters, it is possible to remove ringing due to the cut-off frequency of the filters and an effect such as elimination of disturbance by ringing at rise of sound in an audio system, fringing due to ringing of a reproduced image in an imaging system, etc. can be obtained.

What is claimed is:

1. A DA converter comprising:
   pulse signal generating means for generating pulse signals having a first sampling period;
   delayed pulse signal generating means for delaying said pulse signals by predetermined different times to generate a plurality of delayed pulse signals;
   switching signal generating means for generating switching signals set with a period corresponding to said first sampling period and at different ON/OFF times, each said switching signal being synchronized with a respective one of said pulse signals and said delayed pulse signals;
   a plurality of filter means for extracting low frequency component signals from digital component signals sampled with said first sampling period;
   switching means for switching an input and an output of each of said filter means by each of said switching signals set at said different ON/OFF times; and
   synthesizing means for synthesizing an analogue component signal by combining outputs of said plurality of filter means.

2. A DA converter according to claim 1, further comprising sampling means, which samples inputted digital component signals with a second sampling period, an output of said sampling means being supplied to each of said filter means through said switching means.

3. A DA converter according to claim 2, wherein said sampling means is a PAM means.

4. A DA converter according to claim 1, wherein said pulse signal generating means includes a ½ frequency dividing circuit.

5. A DA converter according to claim 1, further comprising sampling means, which samples inputted digital component signals with a second sampling period, an output of said sampling means being supplied to each of said filter means through said switching means, and said pulse signal generating means includes a ½ frequency dividing circuit, said second sampling period being three times as long as said first sampling period.

6. A DA converter according to claim 1, wherein said switching signals are pulse signals having an ON time width of $2\tau$ and an OFF time width of $\tau$.

7. A DA converter according to claim 6, wherein said delayed pulse signals are those obtained by delaying said pulse signals several times by a time $\tau$.

8. A DA converter according to claim 1, wherein said filter means includes a plurality of low pass filters connected in parallel, said low pass filters including a plurality of inductors, capacitors and switches, and said switches are turned on and off by a predetermined control signal.

9. A DA converter according to claim 2, wherein said filter means has a cut-off frequency, which is equal to about ½ of the frequency corresponding to said second sampling period.

10. A DA converter according to claim 1, wherein said switching signal generating means and said switching means include ratchet circuits which each have a first terminal, a plurality of second terminals, and a contact which cyclically connects said first terminal to each of said second terminals.

11. A DA converter according to claim 8, wherein said inductors are connected in series through said switches and each of said capacitors is connected between a respective one of said inductors and ground.

12. A DA converter according to claim 8, wherein said inductors are connected in series and each of said capacitors is connected through one of said switches between a respective one of said inductors and ground.

* * * * *